United States Patent [19]
Henstrom et al.

[11] Patent Number: 5,754,463
[45] Date of Patent: May 19, 1998

[54] MULTI-PORTED CONTENT ADDRESSABLE MEMORY WITH PRECHARGE "NON MATCH"

[75] Inventors: Alexander Henstrom, Beaverton; Robert Martell, Hillsboro, both of Oreg.

[73] Assignee: Intel Corporation, Santa Clara, Calif.

[21] Appl. No.: 683,526

[22] Filed: Jul. 15, 1996

[51] Int. Cl.$^6$ .................................................. G11C 7/00
[52] U.S. Cl. .................................................. 365/49; 365/203
[58] Field of Search .................................. 365/49, 203

[56] References Cited

U.S. PATENT DOCUMENTS

| | | | |
|---|---|---|---|
| 5,396,448 | 3/1995 | Takayanagi et al. | 365/49 |
| 5,426,602 | 6/1995 | Lukoff | 365/49 |
| 5,428,565 | 6/1995 | Shaw | 365/49 |
| 5,490,102 | 2/1996 | Jubran | 365/49 |
| 5,530,824 | 6/1996 | Peng et al. | 365/49 |

*Primary Examiner*—David C. Nelms
*Assistant Examiner*—Michael T. Tran
*Attorney, Agent, or Firm*—Blakely, Sokoloff, Taylor & Zafman

[57] ABSTRACT

A content addressable memory (CAM) is disclosed which includes a memory cell, a comparator, a hit signal line, and a miss signal line. In one embodiment, an incoming signal is compared to the contents of the memory cell. If the incoming signal matches the memory cell contents, a hit signal is asserted on the hit signal line. The miss signal line is precharged. The hit signal controls the discharge of the miss signal line, such that the miss signal line is discharged only if the hit signal is asserted. The CAM can be expanded to generate additional miss signals by providing for the comparison of additional incoming signals to the memory cell, or to make the discharge of the miss signal line dependent on the hit signals generated by comparisons between additional incoming signals and the contents of additional memory cells. Miss signals from more than one memory cell can be combined to yield a match signal, which can be used as an input to fast domino circuitry. An exemplary implementation is shown in which the CAM of the present invention is used as the ready circuit in a reservation station of a microprocessor.

11 Claims, 9 Drawing Sheets

FIG. 1 *(PRIOR ART)*

MULTI-PORTED CONTENT ADDRESSABLE MEMORY WITH PRECHARGE "NON MATCH"

FIELD OF THE INVENTION

The invention relates to the fields of content addressable memories and data dependency checking.

BACKGROUND OF THE INVENTION

Content addressable memories (CAMs) are used in applications where memory locations must be identified by their contents, not by their addresses. These applications include logical-to-physical address translation in virtual memory systems, and tag storage in associative cache memory systems.

A prior art CAM cell is illustrated in FIG. 1. Memory cell 101 is used to store bit $A_k$ using cross coupled inverters. Writing to memory cell 101 is accomplished by activating word line 102, thereby causing transistors 103 and 104 to connect memory cell 101 to bit lines 105 and 106. The desired state of the bit to be stored is applied to bit line 105 and its complement to bit line 106. In this manner, memory cell 101 is forced into the desired state. Deactivating word line 102 leaves memory cell 101 in a state representative of the bit applied to bit lines 105 and 106.

When word line 102 is deactivated, the bit stored in memory cell 101 may be compared to data on the bit lines. First, hit line 107 is precharged through transistor 108. Then, bit $B_k$ is applied to bit line 105 and the complement of bit $B_k$ is applied to bit line 106. The comparison is done with two pairs of series connected transistors, 109 and 110. If $A_k$ is low and $B_k$ is high, hit line 107 is discharged through transistors 111 and 112. If $A_k$ is high and $B_k$ is low, hit line 107 is discharged through transistors 113 and 114. If the state of $B_k$ matches the state of $A_k$, the state of hit line 107 remains high.

One advantage of this prior art CAM cell is that to allow storage and comparison of a group of bits, multiple cells can be combined with a wired connection of the cells' hit lines. If any bit applied to a bit line does not match the bit stored in the corresponding flip-flop, the common hit line is discharged to indicate that the applied data does not match the stored data. One disadvantage of this approach is that the common hit line is precharged to a state that indicates a match. This disadvantage is manifested when it is desired to use the common hit line as an input to domino circuitry, such as the ready logic for data dependency checking. FIG. 2 illustrates a problem with using the CAM cell of FIG. 1 for this purpose.

In FIG. 2, assertion of match signal 203 indicates that the data applied to CAM 201 matches the data stored in CAM 201, and assertion of match signal 204 indicates that the data applied to CAM 202 matches the data stored in CAM 202. In either case, the desired data is available, so ready signal 205 will be asserted. Not-ready signal line 206 is precharged when clock 207 is low, and discharged when clock 207 is high and there is either a CAM 201 or a CAM 202 match. When there is not a match, not-ready signal line 206 should not discharge. However, if match signal lines 203 and 204 are precharged, then not-ready signal line 206 will begin to discharge during the high time of clock 207 even when there is not a match.

Therefore, what is needed is a CAM with an output that is precharged to a state that indicates that there is not a match between the applied data and the stored data.

SUMMARY OF THE INVENTION

A content addressable memory (CAM) is disclosed which includes a memory cell, a comparator, a hit signal line, and a miss signal line. In one embodiment, an incoming signal is compared to the contents of the memory cell. If the incoming signal matches the memory cell contents, a hit signal is asserted on the hit signal line. The miss signal line is precharged. The hit signal controls the discharge of the miss signal line, such that the miss signal line is discharged only if the hit signal is asserted. The CAM can be expanded to generate additional miss signals by providing for the comparison of additional incoming signals to the memory cell, or to make the discharge of the miss signal line dependent on the hit signals generated by comparisons between additional incoming signals and the contents of additional memory cells. Miss signals from more than one memory cell can be combined to yield a match signal, which can be used as an input to fast domino circuitry. An exemplary implementation is shown in which the CAM of the present invention is used as the ready circuit in a reservation station of a microprocessor.

DETAILED DESCRIPTION

Data availability determination circuitry using a novel content addressable memory (CAM) cell is described. In the following description, numerous specific details are set forth, such as the number of CAM cells per match signal, in order to provide a thorough understanding of the present invention. It will be obvious, however, to one skilled in the art, that the present invention can be practiced without these specific details. In other instances, some details have been omitted in order to avoid obscuring the present invention.

Figure 1:
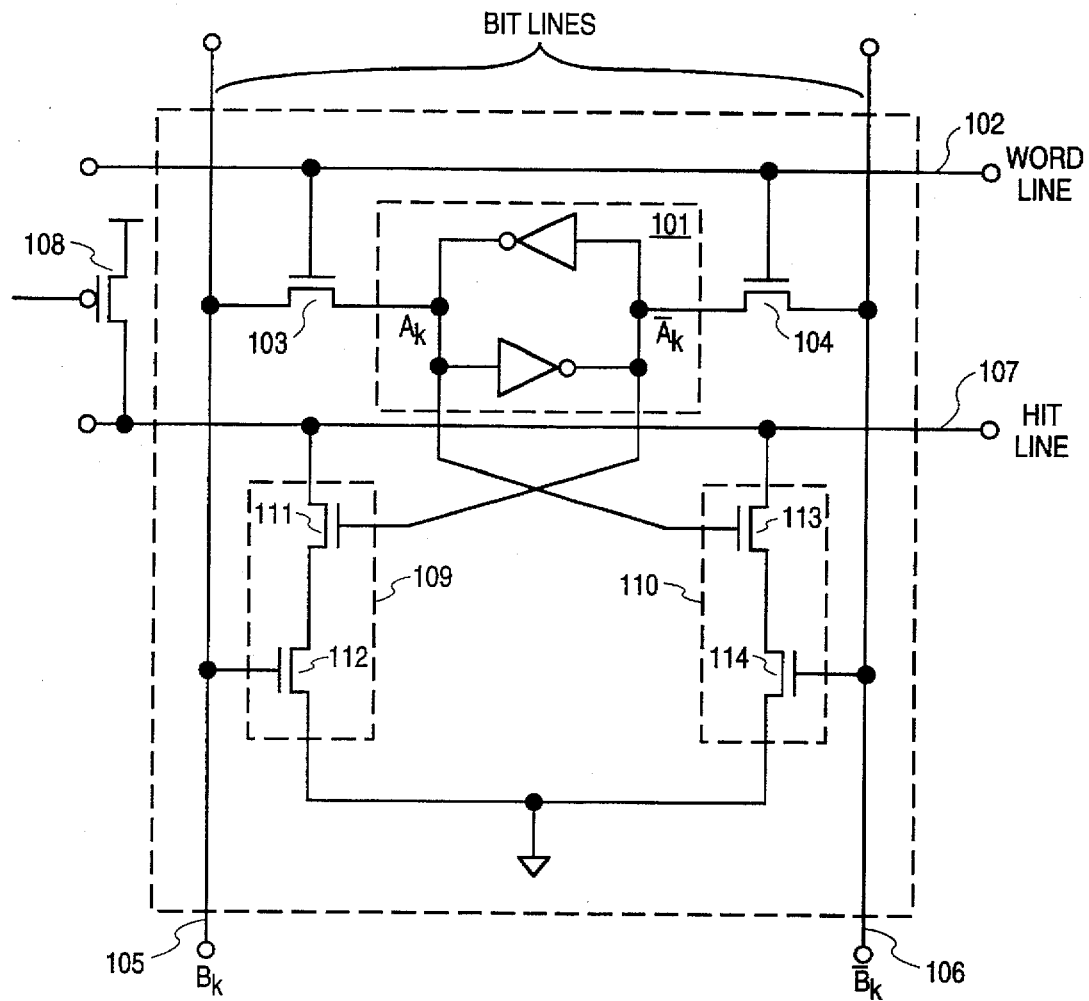
FIG. 1 illustrates a prior art CAM cell.
Figure 2:
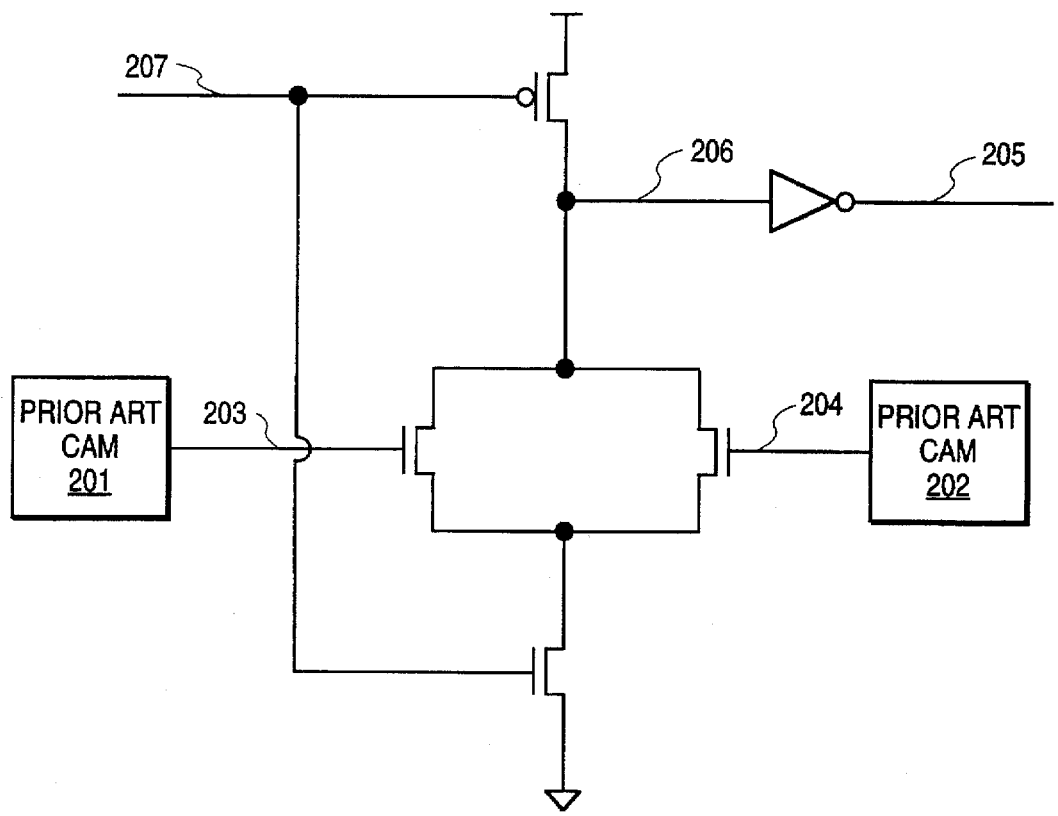
FIG. 2 illustrates a problem in using the prior art CAM cell of FIG. 1 in domino ready logic.
Figure 3:
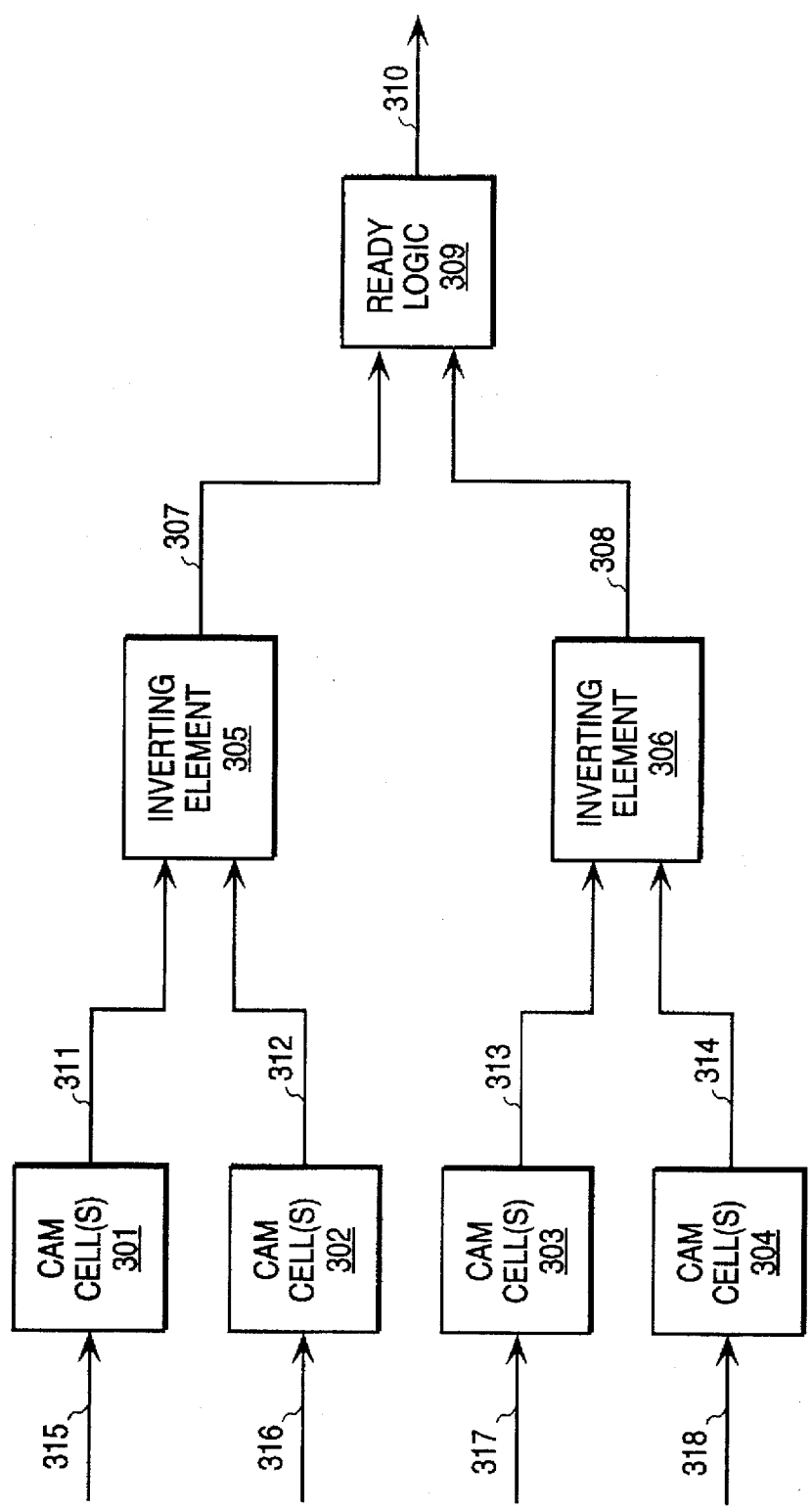
FIG. 3 is a block diagram of data availability determination circuitry using one embodiment of the CAM of the present invention.

FIG. 3 is a block diagram of data availability determination circuitry in accordance with one embodiment of the present invention. CAM cells 301, 302, 303, and 304 store data and generate outputs 311, 312, 313, and 314 based on comparisons between the stored data and incoming data 315, 316, 317, and 318. The outputs 311, 312, 313, and 314 of the CAM cells are combined using inverting elements 305 and 306 to generate match signals 307 and 308. Match signals 307 and 308 are used by ready logic 309 to generate ready signal 310 that indicates whether the desired data is available.

As an example, circuitry like that of FIG. 3 can be used in the reservation station of a superscalar processor. Out-of-order execution of instructions by the processor is facilitated by using the reservation station to store instructions prior to dispatch and execution. A pending instruction is dispatched from the reservation station when all of its operands are available; in other words, when all of its data dependencies are met. In some cases an operand is the result of a prior instruction, so dispatch of the pending instruction is delayed until the result of that prior instruction is available. To determine when a pending instruction's data dependencies are met, the source address of the desired data is stored in the CAM. When the result of any prior instruction becomes available, the destination address of the resulting data is applied to the CAM to be compared to the stored address. If the applied destination address matches the stored source address, the ready signal is asserted to indicate that the pending instruction is ready for dispatch.

One advantage of the CAM of the present invention is that ready logic 309 can be implemented in domino logic in a fashion fast enough to meet the performance requirements of high speed pipelined microprocessors. With CAM cells 301, 302, 303, and 304 precharged to a state that indicates there is not a match, match signals 307 and 308 can cascade directly into ready logic 309 without inadvertently discharging ready logic 309 at the beginning of the evaluate state. Another advantage is the expandability afforded by the CAM cell. Multiple CAM cells can be combined within blocks 301, 302, 303, and 304, and multiple CAM cell outputs can be combined in blocks 305 and 306. The CAM can be further expanded by adding additional match inputs to ready logic 309. Also, each CAM cell can be multi-ported to allow multiple parallel comparisons against the stored data.

Figure 4:
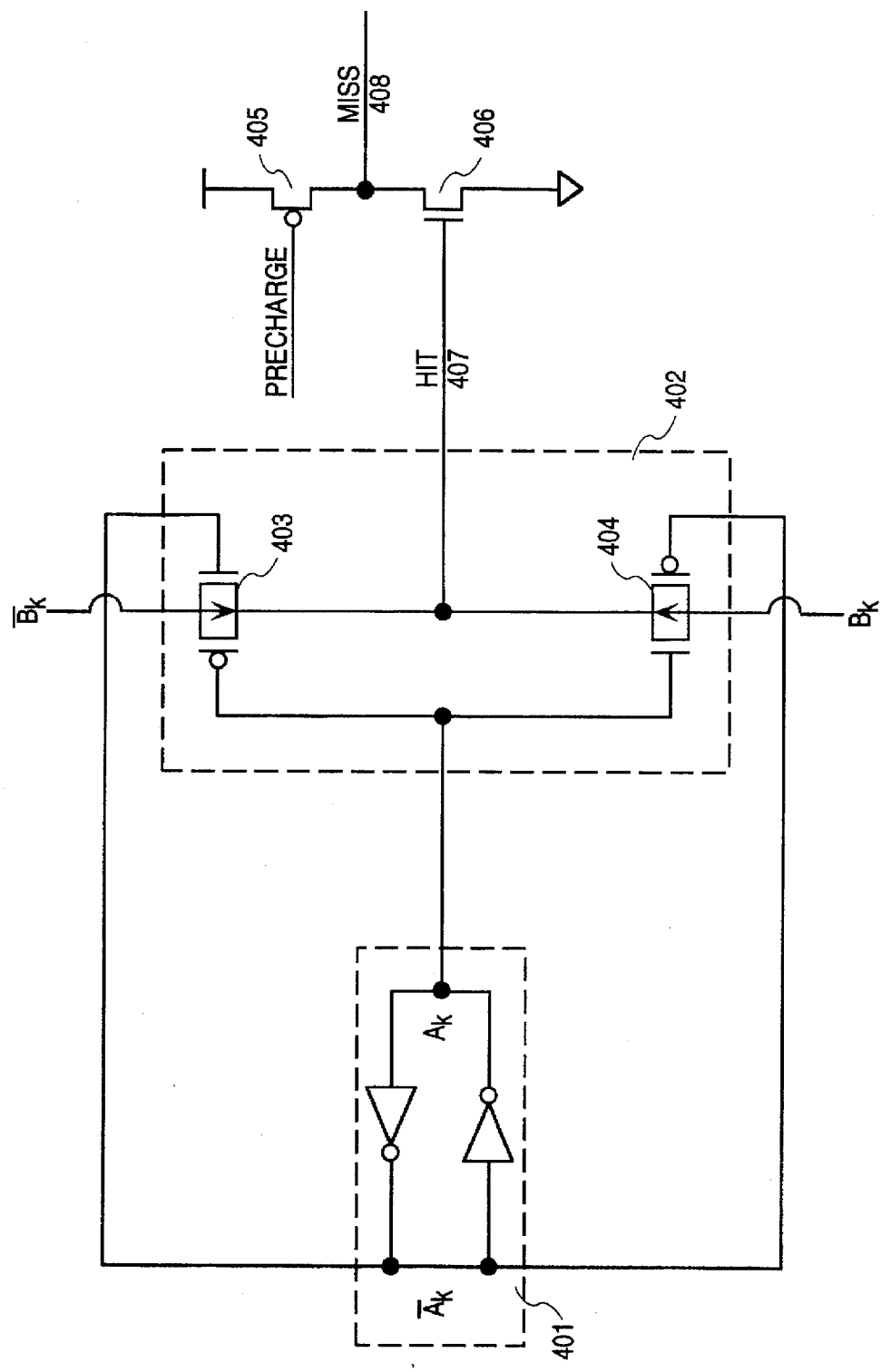
FIG. 4 illustrates one embodiment of a single CAM cell of FIG. 3.

FIG. 4 illustrates one embodiment of a single CAM cell 301, 302, 303, or 304 of FIG. 3. The CAM cell includes memory cell 401, comparator 402, precharge transistor 405, and discharge transistor 406. Memory cell 401 can be implemented in a variety of well-known configurations. It is shown as an ordinary static memory cell having cross-coupled inverters. The write circuitry for memory cell 401 is not shown, but various well-known implementations can be used. Assume bit $A_k$ has been written to memory cell 401. Comparator 402 is then used to compare the state of bit $A_k$ to the state of incoming bit $B_k$.

Comparator 402 can be implemented with an XNOR configuration of CMOS pass gates 403 and 404. In this case, bit $B_k$ is applied to the input of pass gate 404 and the complement of bit $B_k$ is applied to the input of pass gate 403. If $A_k$ is high, $B_k$ is transmitted to hit signal line 407. If $A_k$ is low, the complement of $B_k$ is transmitted to hit signal line 407. Therefore, if the state of $B_k$ matches the state of $A_k$, a high signal is transmitted to hit signal line 407. If the state of $B_k$ does not match the state of $A_k$, a low signal is transmitted to hit signal line 407. Practitioners in the art will appreciate that many other comparator implementations are possible in view of the disclosure provided in this specification. For instance, FIG. 4 shows both bit $B_k$ and the complement of bit $B_k$ as inputs to the CAM cell. Alternatively, the complement of bit $B_k$ can be generated internal to the CAM cell.

The output of the CAM cell of FIG. 4 is the miss signal on miss signal line 408. Miss signal line 408 is precharged through precharge transistor 405. Hit signal line 407 is coupled to the gate of discharge transistor 406, such that if the hit signal is high, miss signal line 408 is discharged. If the hit signal is low, the state of miss signal line 408 remains high. Note that in the precharged state, the miss signal is high.

In a preferred embodiment, the inputs to pass gates 403 and 404 are qualified with the same clock that is used to precharge miss signal line 408, such that the input lines become charged only when transistor 405 is off. In that case, no clock enabled pulldown transistor is needed in series with transistor 406 because hit signal 407 cannot go to a high state when miss signal 408 is precharging.

Figure 5:
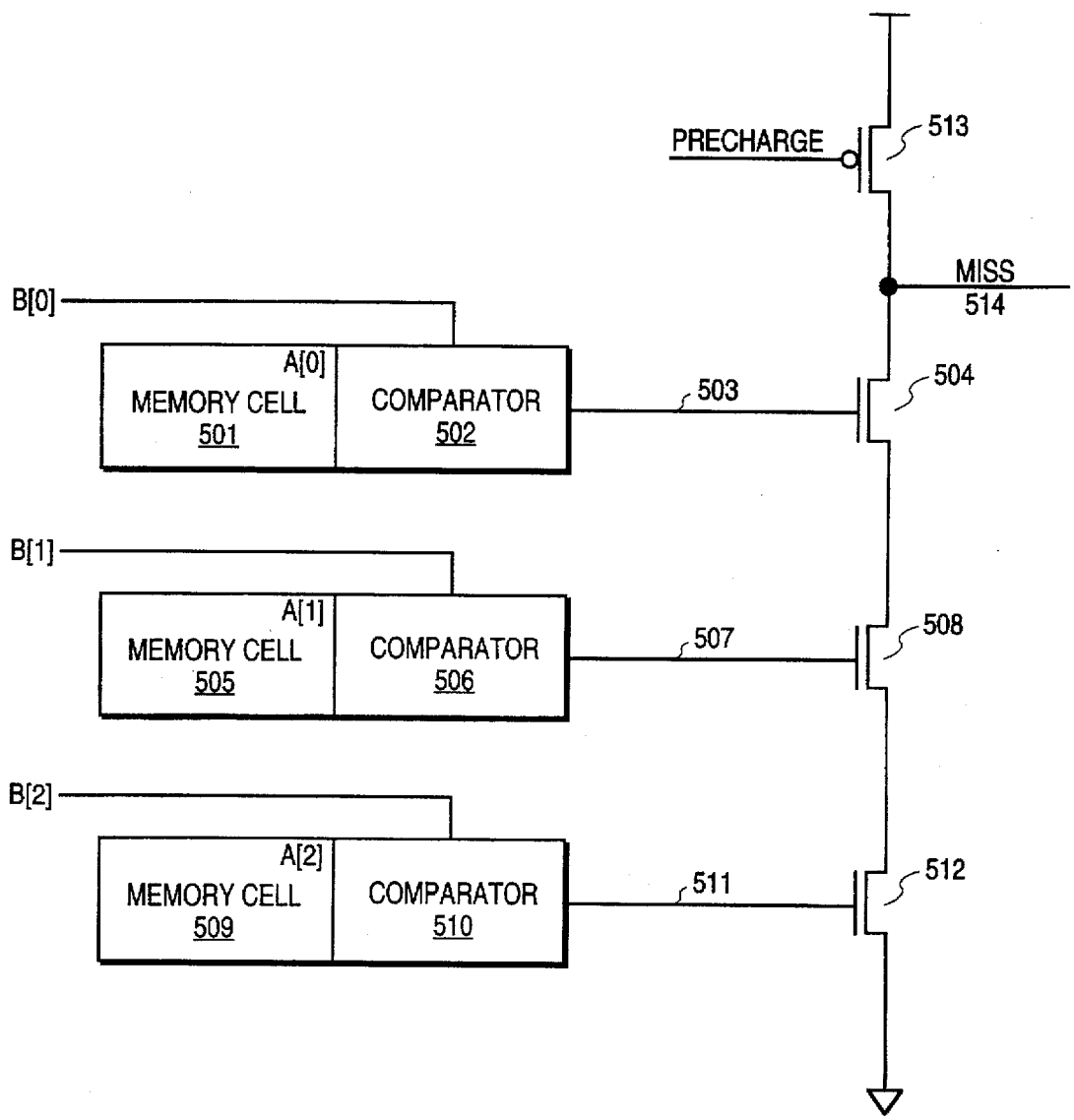
FIG. 5 illustrates how multiple CAM cells of the present invention can be combined to allow storage and comparison of a group of bits.

FIG. 5 illustrates how multiple CAM cells can be combined to allow storage and comparison of a group of bits, referred to as a multi-bit comparison. Three memory cells 501, 505, and 509, along with their corresponding comparators 502, 506, and 510, are configured to allow a three bit comparison. Assume the three memory cells store bits A[2:0]. Bits B[2:0] are applied to comparators 502, 506, and 510. Miss signal line 514 is precharged through precharge transistor 513. If B[2:0] matches A[2:0], hit signals 503, 507, and 511 are asserted, and miss signal line 514 is discharged through discharge transistors 504, 508, and 512. However, if any of bits B[2:0] does not match the corresponding bit of bits A[2:0], at least one of the hit signals 503, 507, and 511 will be deasserted, and the state of miss signal line 514 will remain high.

Figure 6:
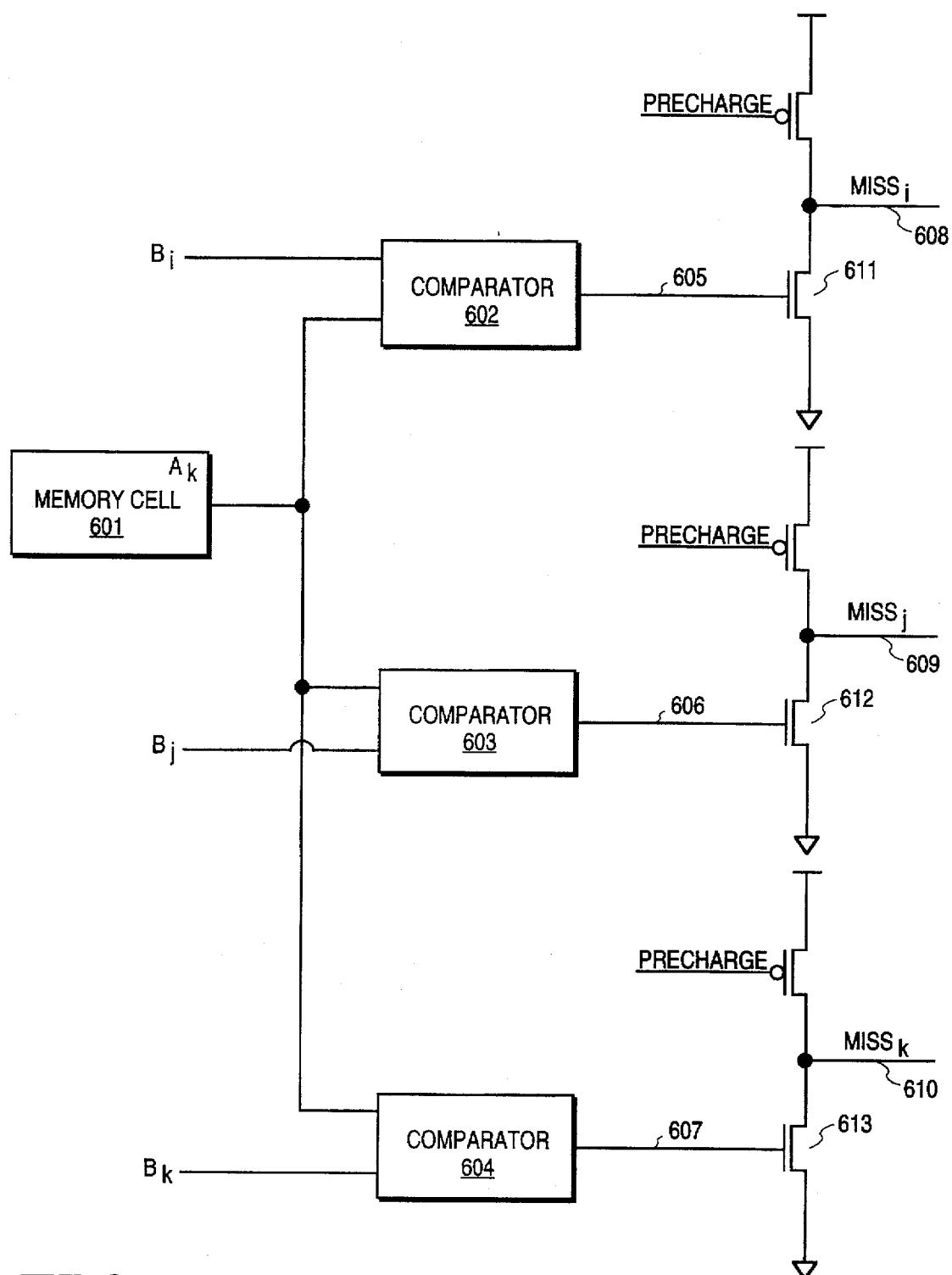
FIG. 6 illustrates how the CAM cell of the present invention can be expanded to generate additional miss signals based on additional incoming signals.

FIG. 6 shows how the CAM cell can be expanded to generate additional miss signals based on additional incoming signals, referred to as a multi-way comparison. Such a configuration is useful when the desired data may come from more than one place. For example, assume that the CAM is used in a superscalar processor to store the source address of dependent data needed for a pending instruction. Assume that the dependent data may come from one of three execution units. Using the present invention as configured in FIG. 6, the destination addresses of the data from each execution unit can be compared in parallel to the source address.

Referring to FIG. 6, assume that bit $A_k$ is stored in memory cell 601. Bits $B_i$, $B_j$, and $B_k$ are applied to comparators 602, 603, and 604 respectively. If any of bits $B_i$, $B_j$, and $B_k$ match bit $A_k$ the corresponding hit signal 605, 606, or 607 will be asserted, and the corresponding miss signal line 608, 609, or 610 will be discharged through the corresponding discharge transistor 611, 612, or 613.

Figure 7:
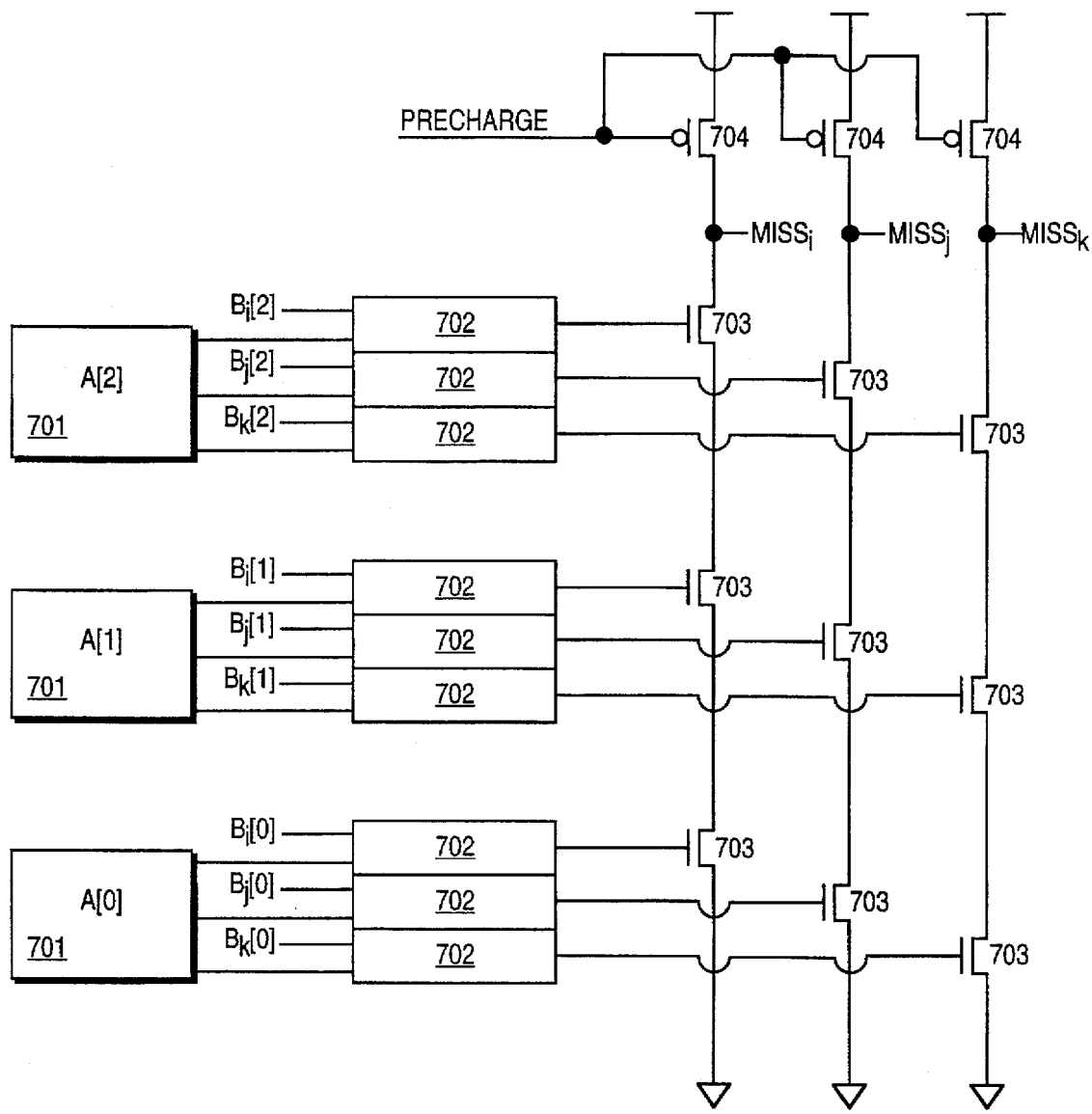
FIG. 7 illustrates how the CAM cell of the present invention can be used for a three-way, three-bit comparison.

FIG. 7 illustrates how the CAM cell of the present invention can be used for a three-way, three-bit comparison. FIG. 7 includes three memory cells 701, nine comparators 702, nine discharge transistors 703, and three precharge transistors 704. If A[2:0] stored in cells 701 matches $B_i$[2:0], $B_j$[2:0], or $B_k$[2:0] based on comparisons, the corresponding miss signal $Miss_i$, $Miss_j$, or $Miss_k$ discharged.

Figure 8:
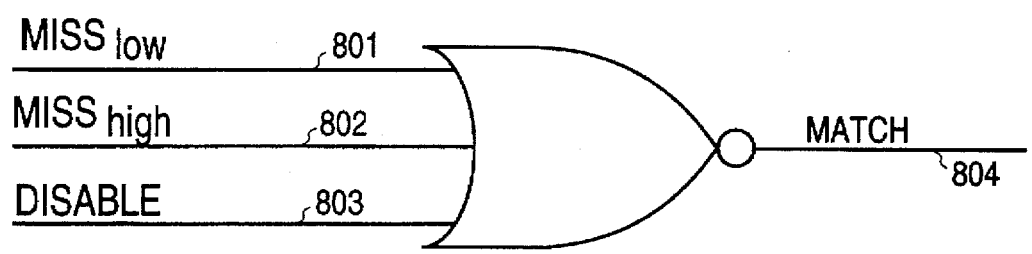
FIG. 8 illustrates one implementation of a single inverting element of FIG. 3.

Returning to the block diagram of FIG. 3, the inverting elements 305 and 306 can be implemented as shown in FIG. 8. Assume for example that a comparison is desired between a 6-bit address stored in CAMs 301 and 302, and a 6-bit incoming address. $Miss_{low}$ signal 801 is the result of a three bit comparison, as shown in FIG. 5, of the three low order bits of the 6-bit addresses. $Miss_{high}$ signal 802 is the result of such a comparison of the three high order bits of the 6-bit addresses. Disable signal 803 can be used to disable the match logic if, for example, the incoming address is not valid. Match signal 804 will be asserted only when disable signal 803 and both miss signals 801 and 802 are all deasserted. Therefore, assertion of match signal 804 indicates that the valid 6-bit incoming address matches the 6-bit stored address. Note that in the precharged state, the miss signals 801 and 802 are high, so match signal 804 will be low. Alternative implementations of inverting elements 305 and 306 are possible. For example, disable signal 803 can be omitted. As another example, the NOR gate can be replaced by its logical equivalent.

Figure 9:
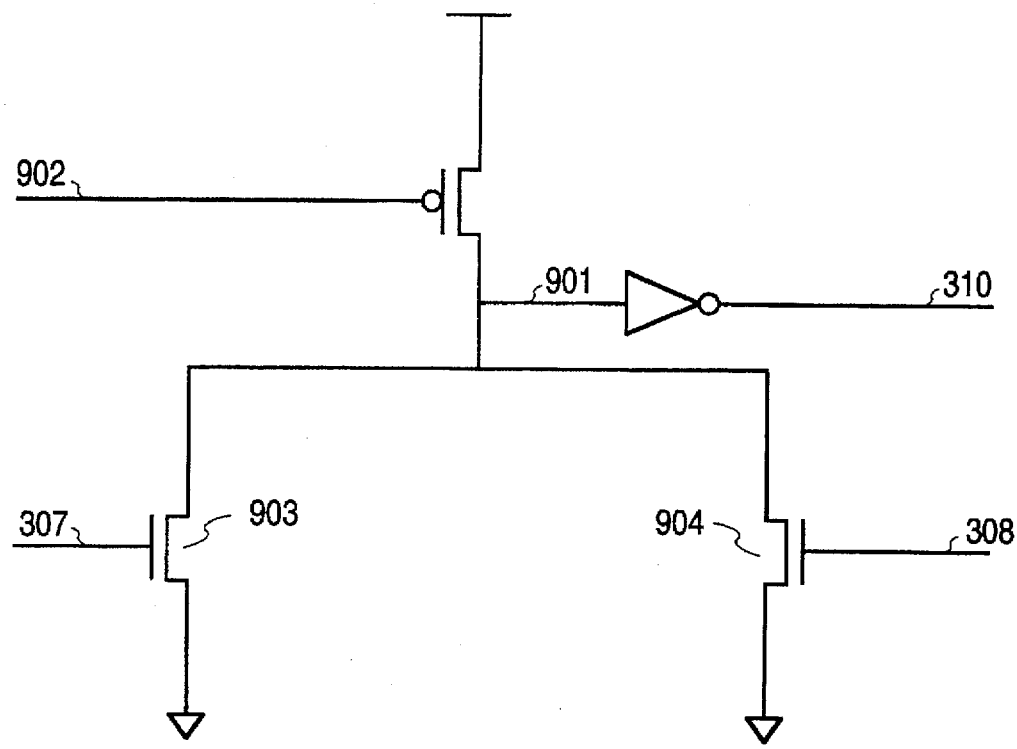
FIG. 9 illustrates one implementation of the ready logic of FIG. 3.

Returning again to the block diagram of FIG. 3, ready logic 309 can be implemented as shown in FIG. 9. Not-ready signal line 901 is precharged while clock signal 902 is low. If either of match signals 307 or 308 is high, not-ready line 901 is discharged. Note that with the preferred embodiment of the CAM cell discussed above, no clock enabled pull-down transistor is needed in series with transistors 903 and 904 because neither match signal 307 nor 308 can go to a high state when signal line 901 is precharging. In the precharged state, the match signals 307 and 308 are low, so not-ready signal line 901 will not begin to discharge until a match signal goes to a high state. Since the match signals are low in the precharged state, the problem wherein the not-ready line is partially discharged even when there is not a match is prevented.

One advantage of implementing ready logic 309 as shown in FIG. 9 is the fast generation of the ready signal even when the ready signal depends on multiple match signals. For each additional match signal, a discharge transistor is added in parallel to discharge transistors 903 and 904. This makes the present invention suitable for use in data availability determination circuitry such as that commonly found in modern superscalar processors.

What is claimed is:

1. A content addressable memory (CAM) comprising:
   means for storing a first data bit;
   means for generating a hit signal based on a comparison of a second data bit and the stored first data bit;
   means for precharging a miss signal; and
   means for discharging the miss signal based on the hit signal.

2. A content addressable memory (CAM) comprising:
   a memory cell having a data bit stored therein;
   a first signal line;
   a hit signal line;
   a comparator having first and second inputs coupled to the first signal line and to the data bit of the memory cell, respectively, the comparator also having an output coupled to the hit signal line; and
   a first and a second transistor coupled in series between a positive potential and ground, the first and second transistors having a common node that provides a miss signal, the gate of the first transistor being coupled to a precharge signal that controls the precharging of the common node, the gate of the second transistor being coupled to the hit signal line to selectively discharge the common node when the first signal line matches the data bit.

3. The CAM of claim 2 further comprising a clock signal having a first phase and a second phase, wherein:
   the common node is precharged during the first phase; and
   the first signal line becomes charged only during the second phase.

4. The CAM of claim 2 further comprising a second signal line complementary to the first signal line, wherein the memory cell also has the complement of the data bit stored therein, and the comparator further comprises:
   a first N channel transistor, the drain of the first N channel transistor being coupled to the first signal line, the source of the first N channel transistor being coupled to the hit signal line, the gate of the first N channel transistor being coupled to the data bit of the memory cell;
   a first P channel transistor, the drain of the first P channel transistor being coupled to the first signal line, the source of the first P channel transistor being coupled to the hit signal line, the gate of the first P channel transistor being coupled to the complement of the data bit of the memory cell;
   a second N channel transistor, the drain of the second N channel transistor being coupled to the second signal line, the source of the second N channel transistor being coupled to the hit signal line, the gate of the second N channel transistor being coupled to the complement of the data bit of the memory cell; and
   a second P channel transistor, the drain of the second P channel transistor being coupled to the second signal line, the source of the second P channel transistor being coupled to the hit signal line, the gate of the second P channel transistor being coupled to the data bit of the memory cell.

5. The CAM of claim 2 further comprising:
   at least one additional first signal line;
   at least one additional hit signal line, the number of hit signal lines being equal to the number of first signal lines;
   at least one additional comparator, with each first input being coupled to one of the additional first signal lines, each second input being coupled to the data bit of the memory cell, and each output being coupled to one of the additional hit signal lines; and
   at least one additional first and second transistor pair, the common node of each pair providing an additional miss signal, the gate of each first transistor being coupled to the precharge signal, the gate of each second transistor being coupled to one of the additional hit signal lines.

6. A content addressable memory (CAM) comprising:
   a plurality of memory cells, each having a data bit stored therein;
   a plurality of first signal lines;
   a plurality of hit signal lines;
   a plurality of comparators, each having a first input coupled to one of the first signal lines, each having a second input coupled to the data bit of one of the memory cells, each comparator also having an output coupled to one of the hit signal lines; and
   a plurality of transistors coupled in series between a positive potential and ground, two of the transistors having a common node that provides a miss signal, the gate of one of the two transistors being coupled to a precharge signal that controls the precharging of the common node, the gates of the second of the two transistors and any other transistors each being coupled to one of the hit signal lines to selectively discharge the common node when all of the first signal lines match the corresponding data bit.

7. A method of comparing a data bit to the contents of a memory cell, the method comprising the steps of:
   precharging a miss signal line;
   comparing the data bit to the contents of the memory cell to generate a hit signal; and
   conditionally discharging the miss signal line based on the hit signal.

8. Means for determining the availability of data, the means comprising:
   means for storing an address of the data;
   means for generating a plurality of hit signals based on a comparison of an address of available data with the stored address;

means for precharging a plurality of miss signals lines and a not-ready signal;

means for conditionally discharging the miss signal lines based on the hit signals;

means for combining the miss signals to generate a plurality of address match signals; and means for conditionally discharging the not-ready signal line based on the address match signals.

9. Data availability determination circuitry comprising:

a content addressable memory comprising:

at least one memory cell having a data bit stored therein;

a plurality of first signal lines;

a plurality of hit signal lines;

a plurality of comparators, each having a first input coupled to one of the first signal lines, each having a second input coupled to the data bit of one of the memory cells, each comparator also having an output coupled to one of the hit signal lines;

a plurality of miss signal lines; and a plurality of first and second transistor pairs, the first and second transistors of each pair coupled in series between a positive potential and ground, the first and second transistors of each pair having a common node coupled to one of the miss signal lines, the gate of each first transistor being coupled to a precharge signal that controls the precharging of each common node, the gate of each second transistor being coupled to one of the hit signal lines to selectively discharge the corresponding common node when the corresponding first signal line matches the corresponding data bit;

a plurality of inverting gates, each comprising:

an inverting gate input coupled to at least one of the miss signal lines; and an inverting gate output; and ready determination circuitry comprising:

a not-ready signal line;

a precharge transistor coupled between a positive potential and the not-ready signal line, the gate of the first transistor being coupled to a precharge signal that controls the precharging of the not-ready signal line; and a plurality of discharge transistors coupled in parallel between the not-ready signal line and ground, the gate of each discharge transistor being coupled to one of the inverting gate outputs to selectively discharge the not-ready signal line.

10. The data availability determination circuitry of claim 9 wherein at least one of the inverting gates further comprises a disable input.

11. A method of determining the availability of data, the method comprising the steps of:

storing an address of the data in a content addressable memory (CAM);

precharging a plurality of miss signal lines and a not-ready signal line;

comparing an address of available data with the contents of the CAM to generate a plurality of hit signals;

conditionally discharging the miss signal lines based on the hit signals;

combining the miss signals to generate a plurality of address match signals; and conditionally discharging the not-ready signal line based on the address match signals.

* * * * *